United States Patent
Lee et al.

(10) Patent No.: US 7,868,329 B2
(45) Date of Patent: Jan. 11, 2011

(54) SEMICONDUCTOR DEVICE AND METHOD FOR FABRICATING THE SAME

(75) Inventors: Seok-Woon Lee, Tainan (TW);
Sung-Soo Park, Tainan (TW);
Biing-Seng Wu, Tainan (TW)

(73) Assignees: Chi Mei El Corp., Tainan County (TW);
Chimei Innolux Corporation, Miao-Li County (TW)

(*) Notice: Subject to any disclaimer, the term of this patent is extended or adjusted under 35 U.S.C. 154(b) by 206 days.

(21) Appl. No.: 12/071,523

(22) Filed: Feb. 21, 2008

(65) Prior Publication Data
US 2009/0212293 A1    Aug. 27, 2009

(51) Int. Cl.
*H01L 29/04* (2006.01)
(52) U.S. Cl. .......................... 257/70; 257/66
(58) Field of Classification Search ............ 257/70, 257/72, 245, 249, 317, 335, 344, 371, 401, 257/403, 408
See application file for complete search history.

(56) References Cited

U.S. PATENT DOCUMENTS

| | | | |
|---|---|---|---|
| 6,396,078 B1* | 5/2002 | Uochi et al. | 257/66 |
| 6,727,124 B2* | 4/2004 | Nakajima et al. | 438/154 |
| 6,998,641 B2* | 2/2006 | Makita et al. | 257/66 |
| 7,148,093 B2* | 12/2006 | Makita | 438/166 |
| 2002/0139979 A1* | 10/2002 | Joo et al. | 257/70 |
| 2005/0012096 A1* | 1/2005 | Yamazaki et al. | 257/57 |

\* cited by examiner

*Primary Examiner*—Leonardo Andújar
*Assistant Examiner*—Jordan Klein
(74) *Attorney, Agent, or Firm*—Rabin & Berdo, PC

(57) ABSTRACT

A semiconductor device, comprising a substrate, a semiconductive layer and a gate electrode is provided. The semiconductive layer having a crystallization promoting material is formed over the substrate. The semiconductive layer has a channel region, a first doped region and a second doped region. The first doped region has a donor and an acceptor, and the second doped region has a dopant which is selected from one of the donor and the acceptor. The second doped region is disposed between the first doped region and the channel region. The gate electrode is insulated from the channel region.

8 Claims, 6 Drawing Sheets

SEMICONDUCTOR DEVICE AND METHOD FOR FABRICATING THE SAME

BACKGROUND OF THE INVENTION

1. Field of the Invention

The invention relates in general to a semiconductor device and a method of fabricating the same, and more particularly to a semiconductor device with two doped regions adjacent to the channel region and a method of fabricating the same.

2. Description of the Related Art

Recently, a part of the semiconductive circuits, such as the pixel circuit and the driving circuit, applied to the active-matrix display, have been directly formed on the glass substrate. More semiconductive circuits, such as memory circuits and logic circuits, are also disposed on the glass substrate for to reduce cost. Polysilicon transistor technology, which is characterized by high carrier mobility, is preferably applied to memory circuits or logic circuits that ought to be operated in high velocity. In general, low temperature polysilicon (LTPS) technology is in the mainstream of methods for fabricating polysilicon transistors, as the glass and the circuits formed on it undergo lower temperature and less damage during the fabricating process. Among LTPS technology, attention is focused upon the metal induced crystallization (MIC) process because it is characterized by high displaying uniformity, reduced number of compensating circuits used in pixel circuits, high yield, and high opening ratio. During the MIC process, the metal, so-called catalyst, is doped into the amorphous silicon to decrease the required temperature at which amorphous silicon is able to be transformed to polysilicon.

However, if the catalyst were left in the polysilicon layer, the channel region composed of polysilicon and catalyst would become defective, so as to cause leakage of current. Even if the XV group elements or halogen were added to the polysilicon layer other than in the channel region to attract the catalyst from the channel region, the catalyst which remains in the channel region after this treatment, still results in a deep level defect and leakage of current so as to make the character of the transistor deteriorate.

SUMMARY OF THE INVENTION

In view of the foregoing, it is an object of the present invention to provide a semiconductor device and a method of fabricating the same, which is capable of decreasing the crystallization promoting material in the channel region and improving the electric character of the semiconductor device.

The invention achieves the above-identified object by providing a semiconductor device, comprising a substrate, a semiconductive layer and a gate electrode. The semiconductive layer having a crystallization promoting material is formed over the substrate. The semiconductive layer has a channel region, a first doped region and a second doped region. The first doped region has a donor and an acceptor, and the second doped region has a dopant which is selected from one of the donor and the acceptor. The second doped region is disposed between the first doped region and the channel region. The gate electrode is insulated from the channel region.

It is another object of the invention to provide a method for fabricating a method of fabricating a semiconductor device, comprising (a) providing a substrate; (b) forming a semiconductive layer having a crystallization promoting material on the substrate; (c) forming a channel region, a first doped region, and a second doped region in the semiconductive layer, the second doped region positioned between the first doped region and the channel region, wherein the first doped region has two dopants including a donor and a acceptor, the second doped region has a dopant selected from one of the donor and the acceptor; (d) forming a gate electrode insulated from the channel region; and (e) recovering the semiconductor device with a heat treatment so as to allow the crystallization promoting material to be moved away from the channel region.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
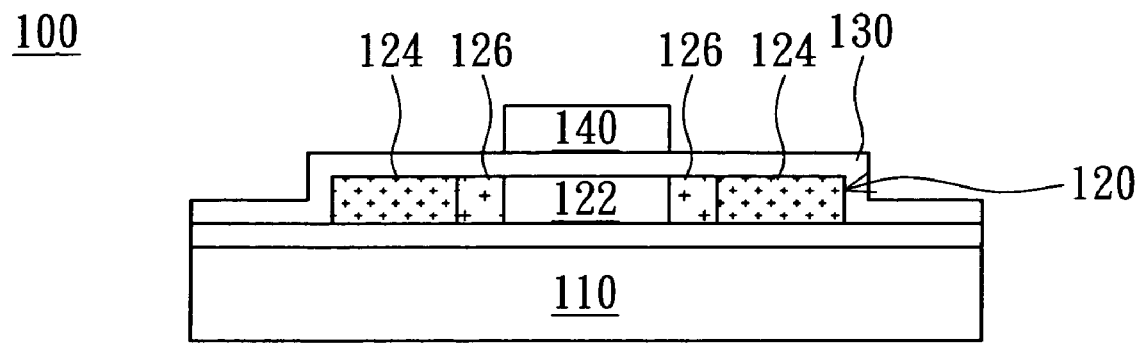
FIG. 1 is a cross-sectional view illustrating a semiconductor device of top-gate structure according to the first embodiment of the invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The semiconductor device of the invention comprises a substrate, a semiconductive layer, and a gate electrode. The semiconductive layer having a crystallization promoting material is formed over the substrate, and the semiconductive layer has a channel region, a first doped region, and a second doped region. The first doped region has a donor and an acceptor, and the second doped region has a dopant which is selected from one of the donor and the acceptor. The second doped region is disposed between the first doped region and the channel region. The gate electrode is insulated from the channel region.

The donor comprises at least one element selected from VA group elements, including nitrogen (N), phosphorus (P), arsenic (As), antimony (Sb), and bismuth (Bi). The acceptor comprises at least one element selected from IIIA group elements including boron (B), aluminum (Al), gallium (Ga), indium (In), and thallium (Tl). The crystallization promoting material is selected from iron (Fe), cobalt (Co), nickel (Ni), ruthenium (Ru), rhodium (Rh), palladium (Pd), osmium (Os), iridium (Ir), platinum (Pt), copper (Cu), aurum (Au) or combination thereof to catalyze the transformation reaction from amorphous silicon to polysilicon.

Different types of the semiconductor device have corresponding kinds and concentration of the dopant doped in the first and second doped regions. If the semiconductor device is an N type transistor, the dopant of the second doped region is the donor, and a concentration of the donor in the first doped region is higher than a concentration of the acceptor in the first doped region. If the semiconductor device is a P type transistor, the dopant of the second doped region is the acceptor, and the concentration of the donor in the first doped region is lower than the concentration of the acceptor in the first doped region.

The crystallization promoting material is apt to be attracted by the acceptor. It is noted that the first doped region doped with both of the donor and the acceptor provides more attractiveness to the crystallization promoting material than one region doped with only acceptor. The first and second doped regions are capable of attracting the crystallization promoting material and making it move away from the channel region.

Further, the second doped region also has both of the accepter and the donor. A concentration of the acceptor in the second doped region is lower than a concentration of the acceptor in the first region when the semiconductor device is a N type transistor, in which a concentration of the donor in the first doped region is higher than a concentration of the acceptor in the first doped region. A concentration of the donor in the second region is lower than a concentration of the donor in the first region when the semiconductor device is a P type transistor, in which a concentration of the donor in the first doped region is lower than the concentration of the acceptor in the first doped region.

The semiconductor device of the invention can be top-gate structure or bottom-gate structure. FIG. 1 is a cross-sectional view illustrating a semiconductor device of top-gate structure according to the first embodiment of the invention. The semiconductor device 100 of the present embodiment comprises a substrate 110, a semiconductive layer 120, a gate insulating layer 130 and a gate electrode 140. The semiconductive layer 120 having a crystallization promoting material is formed on the substrate 110, and the semiconductive layer 120 has a channel region 122, a first doped region 124, and a second doped region 126. The second doped region 126 is disposed between the first doped region 124 and the channel region 122. The gate insulating layer 130 is formed on the semiconductive layer 120. The gate electrode 140 is formed on the gate insulating layer 130 and corresponding to the channel region 122, so that the gate electrode 140 is insulated from the channel region 122. It is noted that a distance X between the channel region 122 and the first doped region 124 is substantially larger than 1 micrometer.

Figure 2:
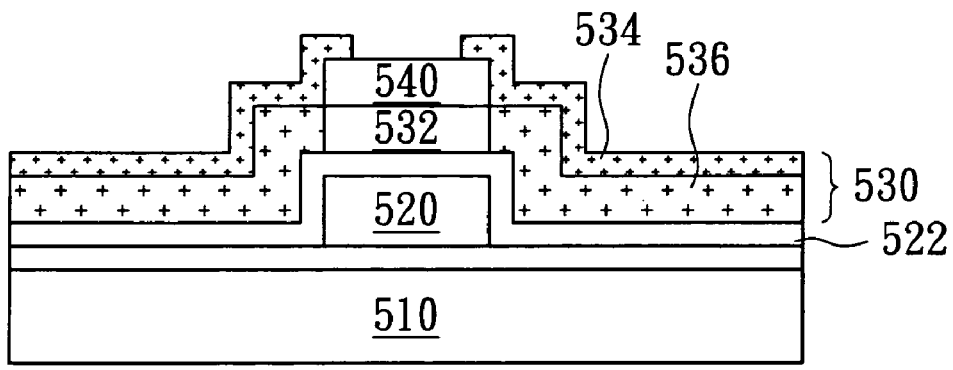
FIG. 2 is a cross-sectional view illustrating a semiconductor device of bottom-gate structure according to the second embodiment of the invention.

FIG. 2 is a cross-sectional view illustrating a semiconductor device of bottom-gate structure according to the second embodiment of the invention. The semiconductor device 500 of the present embodiment comprises a substrate 510, a gate electrode 520, a gate insulating layer 522, a stopper layer 540 and a semiconductive layer 530. The gate electrode 520 is formed on the substrate 510, under the semiconductive layer 530 and corresponds to the channel region 532. The gate insulating layer 522 is formed between the gate electrode 520 and the semiconductive layer 530 for covering the gate electrode 520. The semiconductive layer 530 having a crystallization promoting material is formed on the gate insulating layer 522, and the semiconductive layer 530 has a channel region 532, a first doped region 534, and a second doped region 536. The second doped region 536 is disposed between the first doped region 534 and the channel region 532. The first doped region 534 is formed on the second doped region 536. The stopper layer 540 is formed on the semiconductive layer 530, corresponding to the channel region 532, and covered by a part of the first doped region 536.

The method for fabricating the semiconductor device, comprising providing a substrate; forming a semiconductive layer having a crystallization promoting material on the substrate; forming a channel region, a first doped region, and a second doped region in the semiconductive layer, the second doped region positioned between the first doped region and the channel region, wherein the first doped region has two dopants including a donor and a acceptor, the second doped region has a dopant selected from one of the donor and the acceptor; forming a gate electrode insulated from the channel region; and recovering the semiconductor device with a heat treatment so as to allow the crystallization promoting material to be moved from the channel region.

The donor comprises at least one element selected from VA group elements including nitrogen (N), phosphorus (P), arsenic (As), antimony (Sb), and bismuth (Bi). The acceptor comprises at least one element selected from IIIA group elements including boron (B), aluminum (Al), gallium (Ga), indium (In), and thallium (Tl).

The methods for fabricating the semiconductor device of top-gate structure and bottom-gate structure will be respectively elucidated with drawings in following paragraph since there is a bit difference between them.

FIRST EXAMPLE

The top-gate semiconductor device 100 of the first embodiment can be fabricated by many processes. Four processes are taken for example, but one skilled in the art of the time knows that the invention is not limited these examples. FIGS. 3A~3E are illustrating the method of fabricating the semiconductor device of top-gate structure according to the first example of the invention.

Figure 3A:
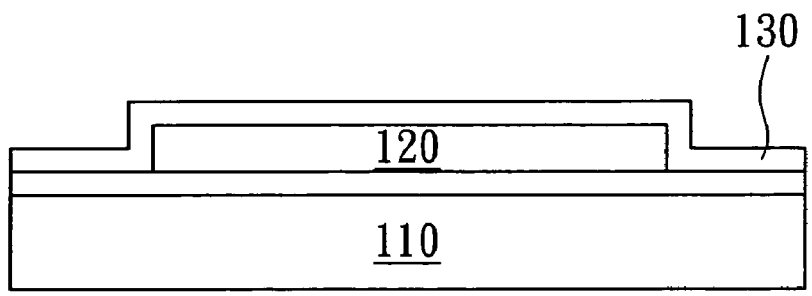
FIGS. 3A~3E are illustrating the method of fabricating the semiconductor device of top-gate structure according to the first example of the invention.

First, a substrate 110 with a semiconductive layer 120 having a crystallization promoting material formed thereon is provided, and a gate insulating layer 130 is formed on the semiconductive layer 120, as shown in FIG. 3A. The semiconductive layer 120, for example, is a polysilicon layer which is transformed from an amorphous silicon layer. The transformation reaction is activated by the crystallization promoting material since the lattice constants of the crystallization promoting material and silicon are similar. The crystallization promoting material is diffused to the amorphous silicon layer to activate the crystallization, so that the crystallization promoting material is distributed throughout the semiconductive layer 120.

Figure 3B:
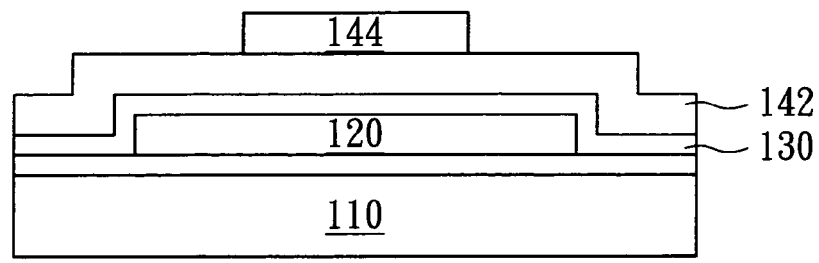
Figure 3C:
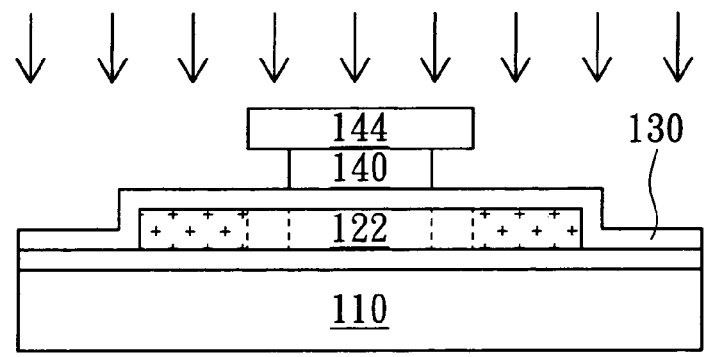
Figure 3D:
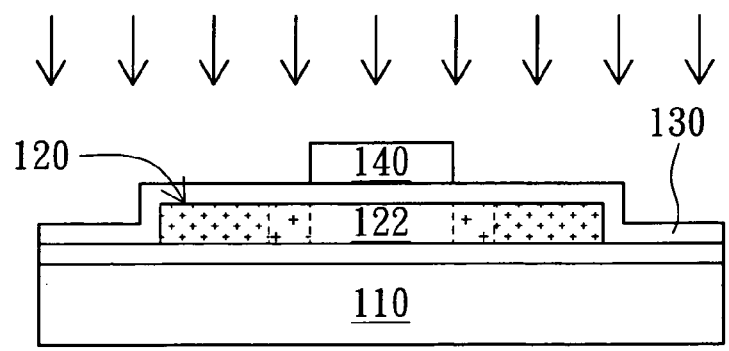
Figure 3E:
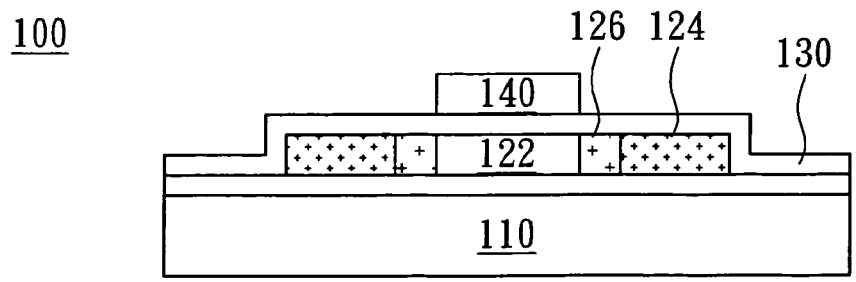

Next, a conductive layer 142 is formed on the gate insulating layer 130, and an patterning a photoresist layer 144 is formed and patterned on the conductive layer 142, as shown in FIG. 3B. Afterward, the conductive layer 142 is etched according to the patterned photoresist layer to form the gate electrode 140, which is narrower than the patterned photoresist layer 144, as shown in FIG. 3C. The difference in width between the gate electrode 140 and the patterned photoresist layer 144 is substantially larger than 1 micrometer. Many kinds of etching, such as wet etching and dry etching, are able to form the gate electrode 140 as stated above, and the wet etching, so-called isotropic etching, is preferred. Referring to FIG. 3C, a first implantation is performed, and the photoresist layer 144 is served as a mask shielding a part of the semiconductive layer 120 and exposing the first doped region (numerical label 124 as shown in FIG. 3E) during the first implantation. Then, the photoresist layer 144 is removed, and a second implantation is performed as shown in FIG. 3D. During the second implantation, the gate electrode 140 is served as a hard mask shielding the channel region 122 and exposing the first doped region (numerical label 124 as shown in FIG. 3E) and the second doped region (numerical label 126 as shown in FIG. 3E).

These two implantations will be disclosed in detail to explain how to fabricate the semiconductor device 100 whose first doped region 124 has a donor and an acceptor and the second doped region 126 thereof has a dopant which is selected from one of the donor and the acceptor. For example, one of the dopants is implanted in the first doped region 124 during the first implantation, and the other of the dopants is implanted in the first doped region 124 and the second doped region 126 during the second implantation. Thus, the first doped region 124 has the donor and the acceptor, the second doped region 126 has a dopant selected from one of the donor and the acceptor. If the semiconductor device 100 is a P type transistor, the donor will be doped in the firs doped region 124 during the first implantation and the acceptor will be doped in both first and second doped region 124 and 126 during the second implantation. P type transistor therefore has a first doped region 124 with both donor and acceptor and second doped region 126 with acceptor only. In addition, both the donor and the acceptor are implanted during the first implantation, and only one of the donor and the acceptor is implanted during the second implantation. It also results in the same structure of the semiconductor device.

On the other hand, the second doped region 126 of the semiconductor device can also be doped with both of the accepter and the donor. For example, one of the donor and the acceptor is implanted during the first implantation, and both of the donor and the acceptor, in which the one has already implanted during the first implantation 124 has lower concentration than that applied during the first implantation, are implanted during the second implantation. If the semiconductor device 100 is a P type transistor, only donor will be doped in the first doped region 124 during the first implantation, and acceptor and donor, whose dosage is lighter than that doped in the first implantation, will be doped in both first and second doped region 124 and 126 during the second implantation. In the P type transistor, both of the first and second doped regions 124 and 126 are doped with donor and acceptor, but concentration of donor in the second doped region 126 is lower than that in the first doped region 124. Moreover, the acceptor and donor can also be implanted during the first implantation since it will not change the concentration of donor in the first and second doped region. Therefore, the first doped region 124 and the second doped region 126 are formed during the first and second implantations, as shown in FIG. 3E. The channel region 122 is also formed and insulated from the gate electrode 140, and the second doped region 126 positioned between the first doped region 124 and the channel region 122. On the other hand, a part of the semiconductive layer 120, which is subject to ion implantation, will be transformed to amorphous silicon of higher energy than the other part of the semiconductive layer consisting of polysilicon. The crystallization promoting material are drove to move toward the part of the semiconductive layer 120 transformed to amorphous silicon, such as the first and second doped region 124 and 126, and away from the other part of the semiconductive layer consisting of polysilicon, such as the channel region 122.

Finally, recovering the semiconductor device 100 with a heat treatment, such as excimer laser annealing (ELA) and rapid thermal annealing (RTA), so as to allow the crystallization promoting material to be moved away from the channel region 122, as shown in FIG. 3E. After the heat treatment, dopants are evenly distributed in the first and second doped region, and the crystallization promoting material moves away from the channel region 122. The force driving the crystallization comes from attractiveness of the dopant and high energy provided from heat, and it drives the crystallization promoting material move away from the channel region 122 and toward the first and doped region 124 and 126. After this heat treatment is applied, most crystallization promoting material stays at the first doped region 124 since it is more attractive to the crystallization promoting material than the second doped region 126. When the semiconductor device 100 proceeds with another heat treatment, the crystallization promoting material within the first doped region 124, which are of higher concentration, will inherently diffuses to the second doped region 126 or even the channel region 122 in which the crystallization promoting material is of lower concentration. The second doped region therefore plays a role of buffer to receive most of diffused crystallization promoting material, so that little crystallization promoting material reach the channel region 122. The crystallization promoting material seldom exists in the channel region 122, and the semiconductor device 100 therefore has improved character. Compared with the prior art, the method disclosed in the first example needs no additional mask so as to reduce the cost.

SECOND EXAMPLE

Figure 4A:
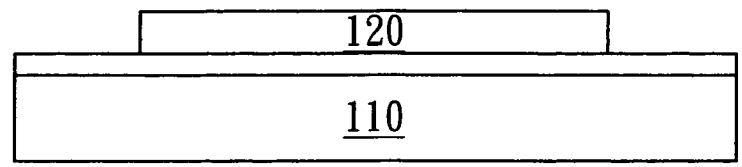
FIGS. 4A~4D are illustrating the method of fabricating the semiconductor device of top-gate structure according to the second example of the invention.
Figure 4B:
Figure 4B:
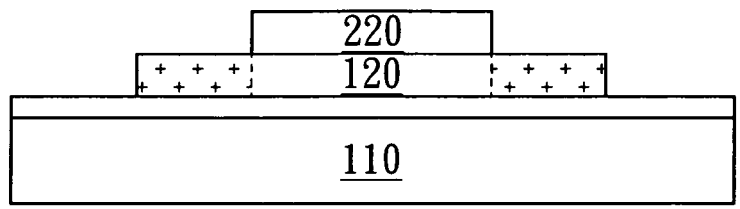
Figure 4C:
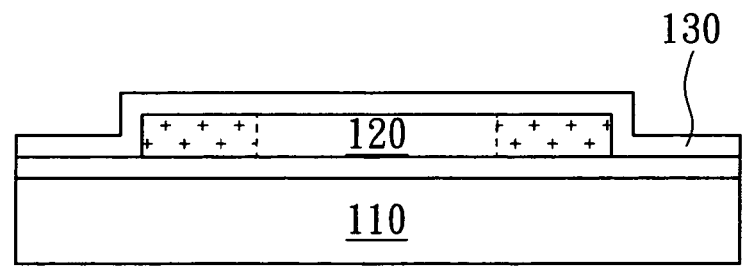
Figure 4D:
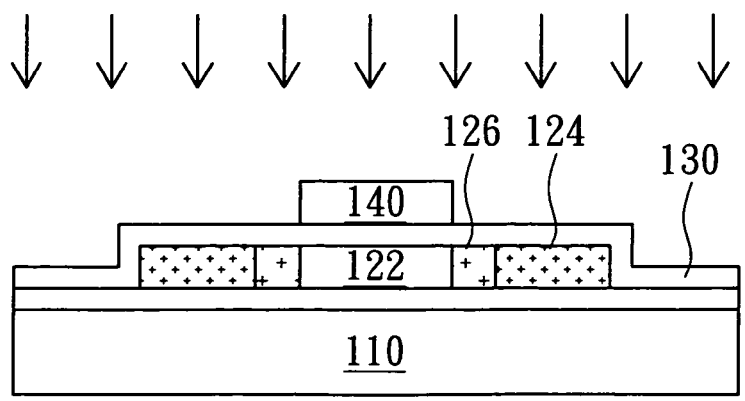

The method of fabricating the semiconductive device according to the second example is similar to that of the first example except the timing of two implantations. Steps same as those in the first example will not be repeated in the following paragraph. FIGS. 4A~4D are illustrating the method of fabricating the semiconductor device of top-gate structure according to the second example of the invention. First, a substrate 110 with a semiconductive layer 120 having a crystallization promoting material formed thereon is provided, as shown in FIG. 4A. Next, a photoresist layer 220 is formed on the semiconductive layer 120, and a first implantation is performed, as shown in FIG. 4B. It is noted that the photoresist layer 220 is wider than the gate electrode (numerical label 140 in FIG. 4D), and the difference in width between the photoresist layer 220 and the gate electrode is preferably larger than 1 micrometer. During the first implantation, the photoresist layer 220 is served as a mask shielding a part of the semiconductive layer 120 and exposing the first doped region (numerical label 124 in FIG. 4D). Afterward, the photoresist layer 220 is removed, and a gate insulating layer 130 is formed on the semiconductive layer 120, as shown in FIG. 4C. Then, a gate electrode 140 is formed on the semiconductive layer 120, and a second implantation is performed, as shown in FIG. 4D. During the second implantation, the gate electrode 140 is served as a mask shielding the channel region 122 and exposes the first doped region 124 and the second doped region 126. Self-alignment technology is applied in the present example since the gate electrode is served as a hard mask. The first doped region 124 and the second doped region 126 are therefore formed during the first and the second implantations.

THIRD EXAMPLE

Figure 5A:
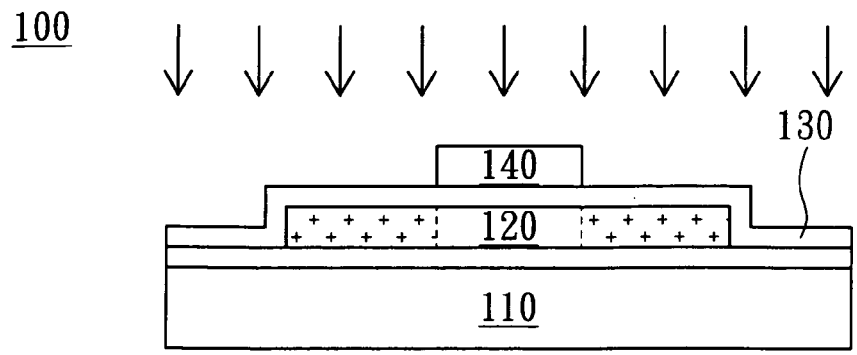
FIGS. 5A~5C are illustrating the method of fabricating the semiconductor device of top-gate structure according to the third example of the invention.
Figure 5B:
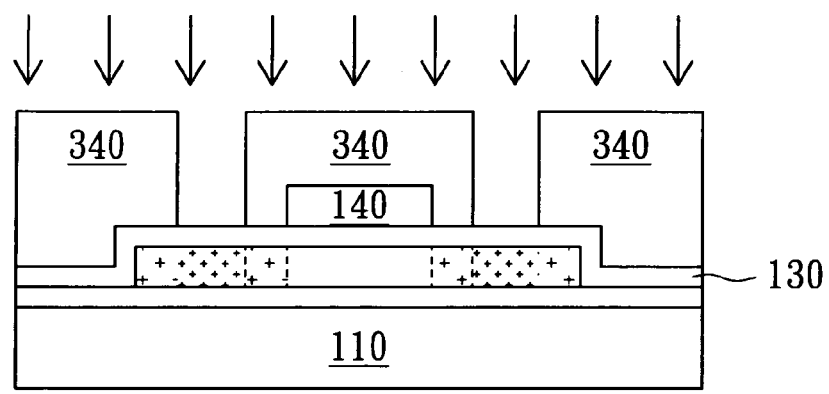
Figure 5C:
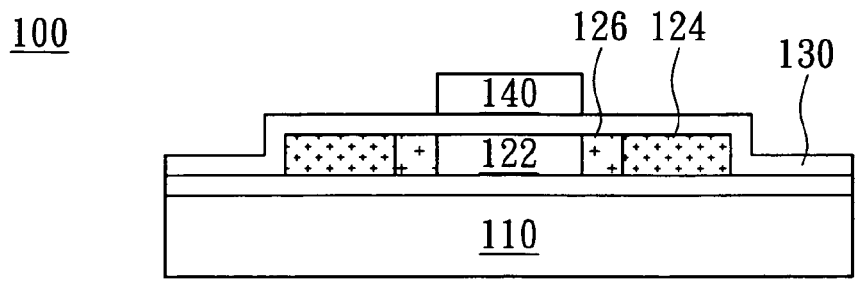

The method of fabricating the semiconductive device according to the third example is similar to that of the first example except the timing of two implantations. Steps same as those in the first example will not be repeated in the following paragraph. FIGS. 5A~5C are illustrating the method of fabricating the semiconductor device of top-gate structure according to the third example of the invention. First, a substrate 110 with a semiconductive layer 120 having a crystallization promoting material formed thereon is provided, and a gate insulating layer 130 and a gate electrode 140 are sequentially formed thereon, as shown in FIG. 5A. A first implantation is performed, and the gate electrode 140 is served as a mask shielding the channel region (numerical label 122 in FIG. 5C) and exposing the first doped region (numerical label 124 in FIG. 5C) and the second doped region (numerical label 126 in FIG. 5C) during the first implantation. Afterward, a photoresist layer 340 is formed on the gate insulating layer 130 and the gate electrode 140 and exposes the first doped region (numerical label 124 in FIG. 5C), and a second implantation is performed as shown in FIG. 5B. During the second implantation, the patterned photoresist layer 130 is served as a mask. The photoresist layer 340 can be patterned according to the original mask for the contact hole so as to reduce cost. The photoresist layer 130 can also be patterned according to a new mask, and it produced a more precise and accurate photoresist layer. The first doped region 124 and the second region 126 are therefore formed during the first and second implantations.

FOURTH EXAMPLE

Figure 6A:
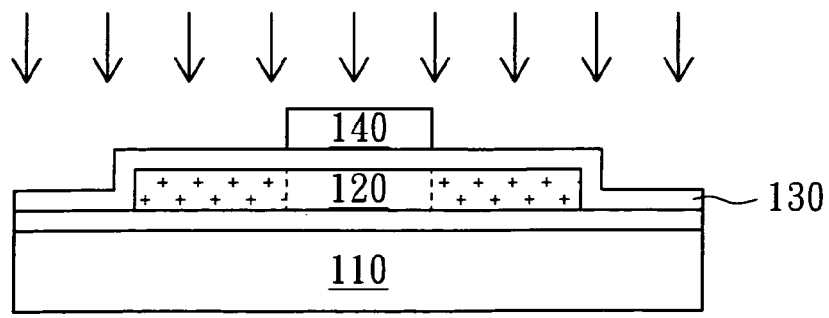
FIGS. 6A~6D are illustrating the method of fabricating the semiconductor device of top-gate structure according to the third example of the invention.
Figure 6B:
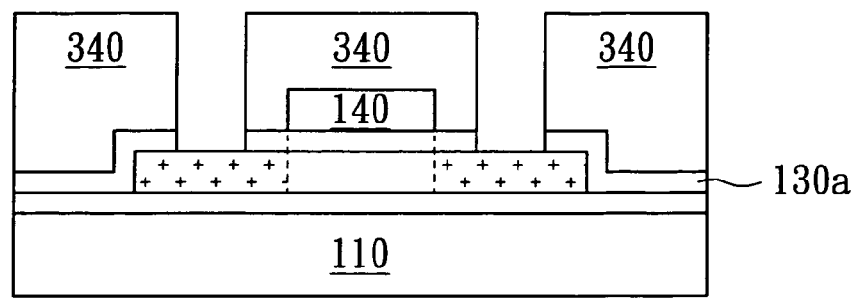
Figure 6C:
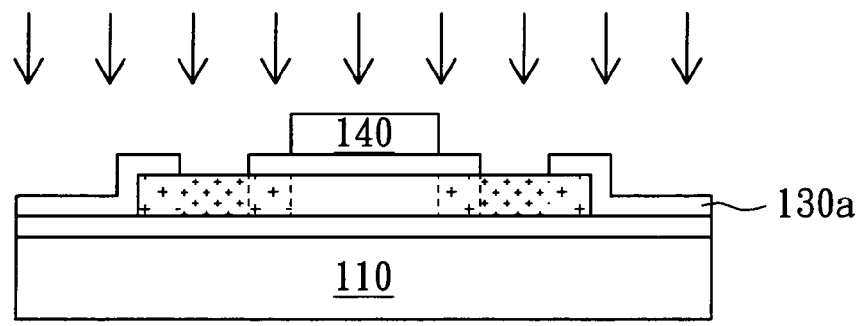
Figure 6D:
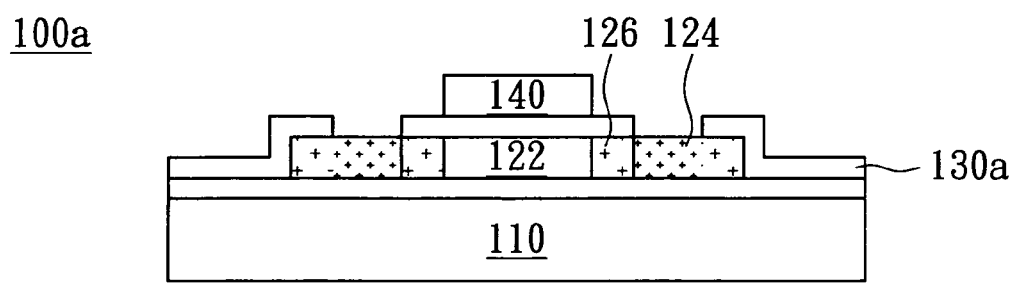

The method of fabricating the semiconductive device according to the forth example is similar to that of the third example except the timing of two implantations. Steps same as those in the third example will not be repeated in the following paragraph. FIGS. 6A~6D are illustrating the method of fabricating the semiconductor device of top-gate structure according to the third example of the invention. First, a substrate 110 with a semiconductive layer 120 having a crystallization promoting material formed thereon is provided, and a gate insulating layer 130 and a gate electrode 140 are sequentially formed thereon, as shown in FIG. 6A. A first implantation is performed, and the gate electrode 140 is served as a mask shielding the channel region (numerical label 122 in FIG. 6D) and exposing the first doped region (numerical label 124 in FIG. 6D) and the second doped region (numerical label 126 in FIG. 6D) during the first implantation. Afterward, a photoresist layer 340 is formed on the gate insulating layer 130 and the gate electrode 140 and exposes the first doped region (numerical label 124 in FIG. 6D), and a part of the gate insulating layer 130 is etched according to the photoresist layer 340 to expose the first doped region (numerical label 124 in FIG. 6D), as shown in FIG. 6B. Next, the photoresist layer 340 is removed, and a second implantation is performed as shown in FIG. 6C. During the second implantation, the remaining gate insulating layer 130a is served as a shielding mask. The semiconductor device 100a is completed as shown in FIG. 6D. The first doped region 124 is directly subjected to the first and second implantation, and the second doped region 126 is subjected to the first implantation through the gate insulating layer 130a. It is easy to create a concentration gradient of the dopant between the first and second doped region during single one implantation since the dopant will be blocked by the gate insulating layer 130a. After the dopant of a concentration is applied to the second implantation, the concentration of the dopant in the second doped region 126 is inherently lower than that in the first region 124.

Figure 7A:
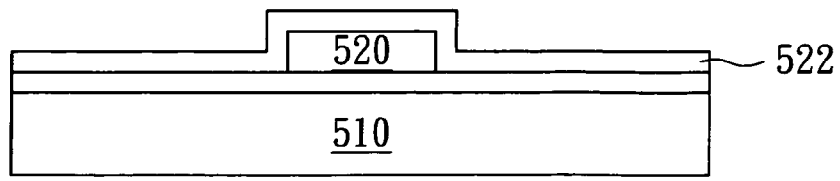
FIGS. 7A~7E are illustrating the method of fabricating the semiconductor device of top-gate structure according to the first example of the invention.
Figure 7B:
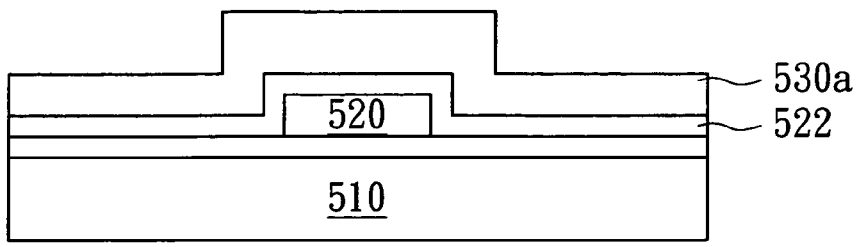
Figure 7C:
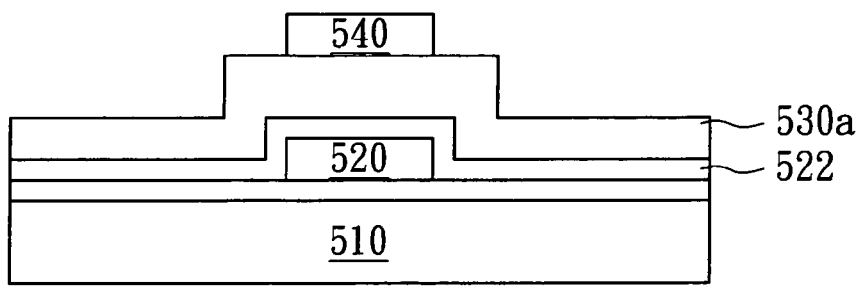
Figure 7D:
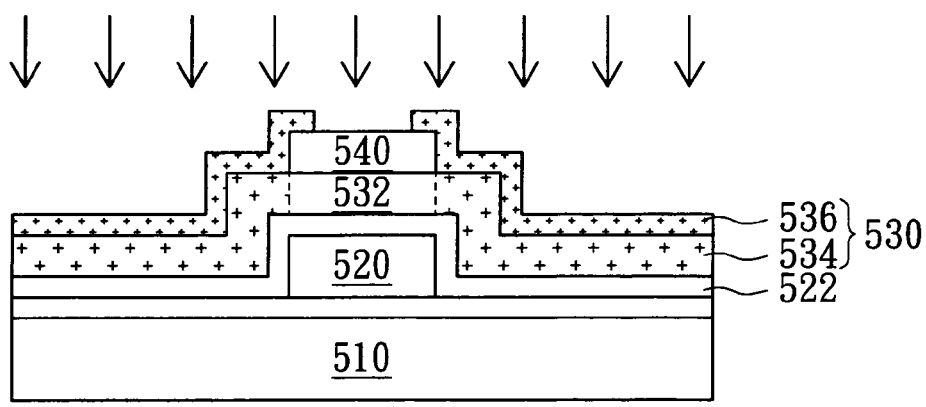
Figure 7E:
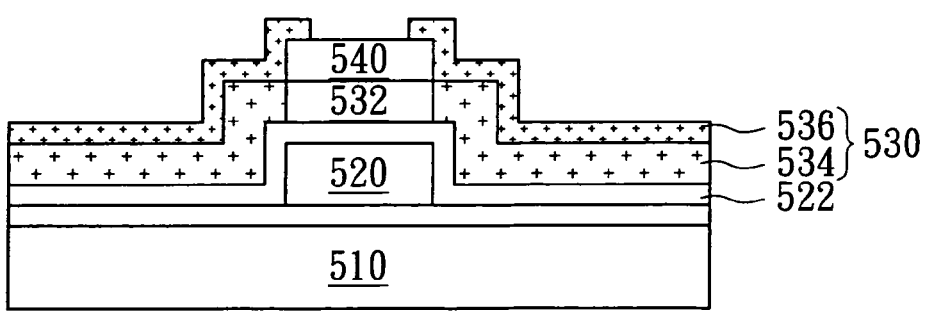

The methods for fabricating the semiconductor device of bottom-gate structure will be elucidated with drawings in following paragraph. FIGS. 7A~7E are illustrating the method of fabricating the semiconductor device of top-gate structure according to the first example of the invention. First, a gate electrode 520 is formed on the substrate 510, and a gate insulating layer 522 covers the gate electrode 520, as shown in FIG. 7A. Next, a first sub-semiconductive layer 534 having crystallization promoting material is formed on the gate insulating layer 522, as shown in FIG. 7B. Then, a stopper layer 540 is formed on the first sub-semiconductive layer 534, as shown in FIG. 7C. Afterward, a second sub-semiconductive layer 536 is formed on the first sub-semiconductive layer 534 which is having one of dopants including the donor and acceptor, wherein the semiconductive layer 530 comprises the first and second sub-semiconductive layers 534 and 536, as shown in FIG. 7D. An implantation is performed, and the stopper layer 540 is served as a mask to shield the channel region 532 and to introduce the other of the dopants into the first doped region 534 and the second doped region 536 during the implantation. The semiconductor device 500 of bottom-gate structure according to the second embodiment of the invention is completed, as shown in FIG. 7E.

As described hereinbefore, the semiconductor device and the method for fabricating the same has many advantages. The first and second doped regions are capable of attracting the crystallization promoting material for make it move away from the channel region. Especially, the second doped region plays a role of buffer to receive most of diffused crystallization promoting material, so that little crystallization promoting material reach the channel region. The crystallization promoting material seldom exists in the channel region, and the semiconductor device therefore has improved character. Compared with the prior art, the method disclosed in the first example needs no additional mask so as to reduce the cost.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a substrate;
   a semiconductive layer having a crystallization promoting material formed over the substrate, the semiconductive layer having:
      a channel region;
      a first doped region having a donor and an acceptor; and
      a second doped region having a dopant which is selected from one of the donor and the acceptor, wherein the second doped region is disposed between the first doped region and the channel region;
   a stopper layer, formed on the semiconductive layer, corresponding to the channel region, and covered by a part of the first doped region; and
   a gate electrode insulated from the channel region.

2. The semiconductor device according to claim 1, wherein if the semiconductor device is a N type transistor, the dopant of the second doped region is the donor, and a concentration of the donor in the first doped region is higher than a concentration of the acceptor in the first doped region.

3. The semiconductor device according to claim 1, wherein if the semiconductor device is a P type transistor, the dopant of the second doped region is the acceptor, and the concentration of the donor in the first doped region is lower than the concentration of the acceptor in the first doped region.

4. The semiconductor device according to claim 1, wherein the acceptor comprises at least one element selected froth IIIA group elements.

5. The semiconductor device according to claim 1, wherein the donor comprises at least one element selected from VA group elements.

6. The semiconductor device according to claim 1, wherein the gate electrode is formed under the semiconductive layer and corresponds to the channel region, the semiconductor device comprises a gate insulating layer, formed between the gate electrode and the semiconductive layer for covering the gate electrode.

7. The semiconductor device according to claim 6, wherein the first doped region is formed on the second doped region.

8. The semiconductor device according to claim 1, wherein the second doped region further having both of the accepter and the donor;

wherein a concentration of the acceptor in the second doped region is lower than a concentration of the acceptor in the first region when the semiconductor device is a N type transistor, in which a concentration of the donor in the first doped region is higher than a concentration of the acceptor in the first doped region;

wherein a concentration of the donor in the second region is lower than a concentration of the donor in the first region when the semiconductor device is a P type transistor, in which a concentration of the donor in the first doped region is lower than the concentration of the acceptor in the first doped region.

* * * * *